United States Patent
Carpenter et al.

(10) Patent No.: US 7,090,727 B2
(45) Date of Patent: Aug. 15, 2006

(54) HEATED GAS LINE BODY FEEDTHROUGH FOR VAPOR AND GAS DELIVERY SYSTEMS AND METHODS FOR EMPLOYING SAME

(75) Inventors: Craig M. Carpenter, Boise, ID (US); Raynald B. Cantin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 09/932,860

(22) Filed: Aug. 17, 2001

(65) Prior Publication Data
US 2003/0033984 A1    Feb. 20, 2003

(51) Int. Cl.
*C23C 16/00*    (2006.01)
*C23F 1/00*    (2006.01)
*H01L 21/306*    (2006.01)

(52) U.S. Cl. .............. 118/715; 118/722; 118/724; 118/666; 156/345.24; 156/345.27; 156/345.28; 156/345.37

(58) Field of Classification Search .............. 118/715, 118/725, 724, 726, 723 R, 728, 50, 722, 666; 219/390, 543; 156/345.24, 345.29, 345.33, 156/345.34, 345.27, 345.28, 345.37; 422/696
See application file for complete search history.

(56) References Cited

U.S. PATENT DOCUMENTS

| | | | | |
|---|---|---|---|---|
| 4,480,930 A | * | 11/1984 | DeZubay et al. | 374/134 |
| 4,638,150 A | * | 1/1987 | Whitney | 219/543 |
| 5,110,407 A | * | 5/1992 | Ono et al. | 438/696 |
| 5,136,978 A | | 8/1992 | Ahern et al. | 118/725 |
| 5,455,014 A | * | 10/1995 | Costantino et al. | 422/696 |
| 5,496,410 A | * | 3/1996 | Fukuda et al. | 118/725 |
| 5,595,606 A | * | 1/1997 | Fujikawa et al. | 118/725 |
| 5,616,208 A | * | 4/1997 | Lee | 156/345.24 |
| 5,704,984 A | | 1/1998 | Lee et al. | 118/724 |
| 5,753,891 A | * | 5/1998 | Iwata et al. | 219/390 |
| 5,882,416 A | | 3/1999 | Van Buskirk et al. | 118/726 |
| 5,935,338 A | | 8/1999 | Lei et al. | 118/725 |
| 5,968,276 A | | 10/1999 | Lei et al. | 118/723 R |
| 6,021,582 A | * | 2/2000 | Wing | 34/576 |
| 6,056,823 A | * | 5/2000 | Sajoto et al. | 118/715 |
| 6,106,628 A | | 8/2000 | Takahashi | 118/725 |
| 6,129,043 A | | 10/2000 | Lai et al. | 118/715 |
| 6,143,077 A | * | 11/2000 | Ikeda et al. | 118/715 |
| 6,159,298 A | * | 12/2000 | Saito | 118/715 |

OTHER PUBLICATIONS

Merriam-Webster's Collegiate Dictionary—10th Ed. p. 1223.*

* cited by examiner

*Primary Examiner*—Rudy Zervigon
(74) *Attorney, Agent, or Firm*—TraskBritt

(57) ABSTRACT

A feedthrough device for use in deposition chambers such as chemical vapor deposition chambers and atomic layer deposition chambers and methods using the same in association with such chambers as well as chambers so equipped. The feedthrough device includes an associated heating device to maintain the temperature of the feedthrough device above a predetermined level and thus maintain a temperature differential between the deposition chamber body and a vaporized organometallic precursor as it passes therethrough. The feedthrough device may include a helical groove formed along the surface of a longitudinal body portion thereof to complementarily receive a resistance type cable heater. The heater may further include a temperature sensing device to assist in monitoring and controlling the temperature of the feedthrough device.

12 Claims, 4 Drawing Sheets

HEATED GAS LINE BODY FEEDTHROUGH FOR VAPOR AND GAS DELIVERY SYSTEMS AND METHODS FOR EMPLOYING SAME

BACKGROUND OF THE INVENTION

1. Field of the Invention

The present invention relates generally to vapor and gas delivery systems and, more particularly, to the heating of a gas line body feedthrough used in a vapor delivery system such as a chemical vapor deposition chamber or an atomic layer deposition chamber.

2. State of the Art

Modern semiconductor processing equipment, specifically chemical vapor deposition (CVD) and atomic layer deposition (ALD) systems, are migrating to the use of organometallic precursors such as tantalum tetraethoxide dimethylamino ethoxide (TAT-DMAE) as well as halogenmetallic chemistries such as $TiCl_4$ and others for metal, metal-oxide and metal-nitride film depositions (collectively referred to herein as organometallic precursors). Conventional precursors have typically been delivered in a gas or vapor state thus making them amenable for use in the vapor deposition process, including ease of maintaining the precursors in the vapor state, as they are delivered to the chamber from the vapor source. However, organometallic precursors are typically delivered for use as a liquid and sometimes as a solid. Many of such precursors have low vapor pressures and others exhibit moderate vapor pressures. The organometallic sources are typically vaporized and transported through the delivery plumbing to the process chamber. Conventional methods of vaporization include the use of bubbler ampoules or direct liquid injection systems, which comprise a chemical ampoule, a liquid flow meter, a heated injector, a carrier gas mass flow controller (MFC) and heated vapor delivery lines between the precursor source and the chamber.

Referring to FIG. 1, a conventional CVD chamber 100 is shown. The chamber 100 includes a body 102 and a lid 104 which are configured to allow removal of the lid 104 from the body 102. The removable lid 104 provides for access to and maintenance of the chamber interior including the chamber cavity 106. A vapor delivery path 107 is conventionally defined to pass through the chamber body 102 using a feedthrough device 108 which connects to the heated vapor plumbing (conduit) 110 at the lower side of the chamber at one end 112 thereof and mates to the lid 104 at the opposite end 114. The vapor delivery path 107 may continue through additional vapor plumbing (conduit) 116 before it travels through the lid 104 and is discharged into the chamber cavity 106 through a vapor delivery head 118, also termed a "showerhead" due to its physical configuration. The vapor is then discharged through the vapor delivery head 118 and is deposited on a semiconductor substrate 120 such as a silicon wafer. The semiconductor substrate 120 is positioned on a susceptor unit 122 during the deposition process as is understood by those of ordinary skill in the art.

One problem with the above described deposition chamber 100 is that the chamber body 102 is maintained at a temperature which is lower than that of the heated vapor plumbing 110. For example, the heated vapor plumbing 110 may be maintained at a temperature of approximately 140 to 160° C. while the chamber body 102 is maintained at a temperature of approximately 45 to 65° C. The reduced temperature of the chamber body 102 causes, through heat transfer, the temperature of feedthrough device 108 to also be lower than that of the heated vapor plumbing 110. The temperature differential between the feedthrough device 108 and the heated vapor plumbing 110 may cause condensation to occur within the vapor delivery path 107 as the vapor passes through the feedthrough 108. Newly utilized organometallic precursors are particularly susceptible to such condensation due to their relatively low vapor pressures.

The occurrence of condensation within the feedthrough 108 may negatively impact the chemical vapor deposition process in various ways. For example, the condensation may result in particulate contaminants flowing through the vapor delivery path 107 and being deposited on the surface of the substrate or wafer 120. Introduction of such particulates ultimately results in a defective semiconductor wafer or other substrate 120 which is unsuited for use in subsequent semiconductor packaging processes.

Additionally, the condensation may cause clogging or material build-up within the feedthrough device 108 as well as in the vapor plumbing 116 positioned downstream therefrom along the vapor delivery path 107. Such clogging may have a deleterious effect on the flow characteristics of the vapor passing therethrough. Additionally, material build-up may have a corrosive effect on the feedthrough device 108 and vapor plumbing 116.

While it is possible to route the heated vapor plumbing 110 around the chamber body 102 such that it connects directly through the lid 104 to the vapor delivery head 118 (thereby eliminating the feedthrough device 108 and additional vapor plumbing 116), in order to provide continual heat to the flowing vapor along the vapor delivery path 107, such a configuration is undesirable for various reasons.

For example, removal of the lid 104 from the chamber body 102 would require mechanical disconnection of the heated vapor plumbing 110. This would increase the amount of time required to service and maintain the CVD chamber 100. Perhaps even more significantly, mechanical disconnection of the heated vapor plumbing 110 would increase the potential for contamination the CVD process and the products produced thereby. Such increased potential for contamination results from the fact that the CVD chamber 100 is conventionally located and operated in a plenum 124 adjacent a clean room (not shown) which may be separated by a barrier 126 from a mechanical room 128. Wafers 120 are passed from the adjacent clean room into the CVD chamber 100 for processing. The implementation of a heated vapor line running exterior to the chamber body 102 in the plenum 124 would require increased maintenance activities within the plenum area 124 resulting in the increased likelihood of particulates and contaminants entering the plenum area 124, or possibly even into the adjacent clean room, each time repair or maintenance is required.

Additionally, the repeated connection and disconnection of the heated gas plumbing (i.e., from the lid 104) leads to the degradation of the mechanical connection. For example, a conventional mechanical connection used in chemical delivery systems includes a VCR® metal gasket face seal fitting. The VCR® fitting provides for the compression of a metal (or sometimes polymer) gasket between two opposing toroid surfaces. After repeated compression (i.e., resulting from repeated disconnection and connection of the piping) the toroid surfaces will flatten out and ultimately fail to seal. This necessitates costly replacement of the fitting and may possibly require the fabrication and welding of new piping hardware.

In view of the shortcomings in the art, it would be advantageous to provide a deposition chamber which allowed for the use of organometallic precursors having relatively low vapor pressures without condensation of such organometallic precursors occurring during delivery of the vapor to the chamber.

It would also be advantageous to provide a method of modifying existing deposition chambers to allow the use of organometallic precursors therewith. Particularly, it would be advantageous to provide a method of converting a chemical vapor deposition chamber configured for use with conventional precursors into an atomic layer deposition chamber or a chemical vapor deposition chamber suited for use with organometallic precursors.

BRIEF SUMMARY OF THE INVENTION

In accordance with one aspect of the invention, a feedthrough device is provided for delivering vapor through the chamber body of a deposition chamber. The feedthrough device includes a longitudinal body section having a first end and a second end. A bore or lumen is defined within the longitudinal body and extends longitudinally therethrough from the first end to second end for delivering an amount of vapor therethrough.

A heating device associated with the longitudinal body of the feedthrough device is oriented and configured to heat the feedthrough device to a desired temperature and maintain the temperature thereof. The feedthrough device, including the longitudinal body and associated heating device, is configured to be complementarily received within an interior portion of the chamber body.

The feedthrough device is further configured to be sealingly coupled with vapor plumbing externally located relative to the chamber body. The vapor plumbing and feedthrough device cooperatively define a vapor delivery path through which vapor is carried to a cavity within the chamber body for deposition on a substrate such as a silicon wafer.

The feedthrough device may be formed of stainless steel or some other material exhibiting good thermal conductivity and corrosion resistance so as to efficiently transfer the heat from the heating device through the body of the feedthrough device and ultimately to the vapor passing through the bore thereof.

In accordance with another aspect of the invention, a deposition chamber is provided which may be suitable for use in conjunction with either a chemical vapor deposition process or an atomic layer deposition process. The deposition chamber includes a chamber body having a chamber cavity defined therein for receipt of a substrate such as a silicon wafer to have a material deposited thereon. A chamber lid is configured to enclose the chamber cavity of the chamber body in cooperation with the chamber body. A vapor delivery path is defined to carry vapor from a vapor source through the chamber body to a vapor delivery head within the chamber cavity. A feedthrough device serves to define a portion of the vapor delivery path which extends through the chamber body. To protect against potential condensation of the vapor, the feedthrough device includes an associated heating device to maintain the temperature of the feedthrough device, and the vapor passing therethrough, at a desired temperature.

The deposition chamber may include additional features to help maintain the temperature of the vapor as it travels along the vapor delivery path. For example, the deposition chamber may include a section of vapor plumbing interposed between the feedthrough device and the vapor delivery head. The section of vapor plumbing may be insulated to protect against heat loss therefrom. Additionally, the feedthrough device may be thermally insulated with respect the chamber body to increase the efficiency of the heating device associated with the feedthrough device.

In accordance with another aspect of the invention, a method is provided for converting a chemical vapor deposition chamber having a chamber body, a chamber lid, and a feedthrough device positioned in a portion of the chamber body, into an atomic layer deposition chamber. The method includes removing the feedthrough device from the chamber body and replacing it with a heated feedthrough device. The heated feedthrough device may be a new, similarly shaped feedthrough device having a heating device associated therewith. Alternatively, the heated feedthrough device may comprise the original feedthrough device modified to include an associated heating device therewith.

In accordance with yet another aspect of the invention, a method is provided for delivering vapor to a vapor delivery head in a deposition chamber. The method includes providing a source of vapor and defining a vapor delivery path between the source of vapor and the vapor delivery head. Defining the vapor delivery path includes providing a first section of plumbing between the vapor source and the chamber body of the deposition chamber. Additionally, a feedthrough device is provided within a portion of the chamber body and is sealingly coupled to the first section of plumbing. A second section of plumbing is provided between the feedthrough device and the vapor delivery head and is accordingly coupled with the feedthrough device. Vapor is introduced into the vapor delivery path from the vapor source. The first section of vapor plumbing and the feedthrough device are heated to eliminate the potential for condensation of the vapor as it travels through the vapor delivery path.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
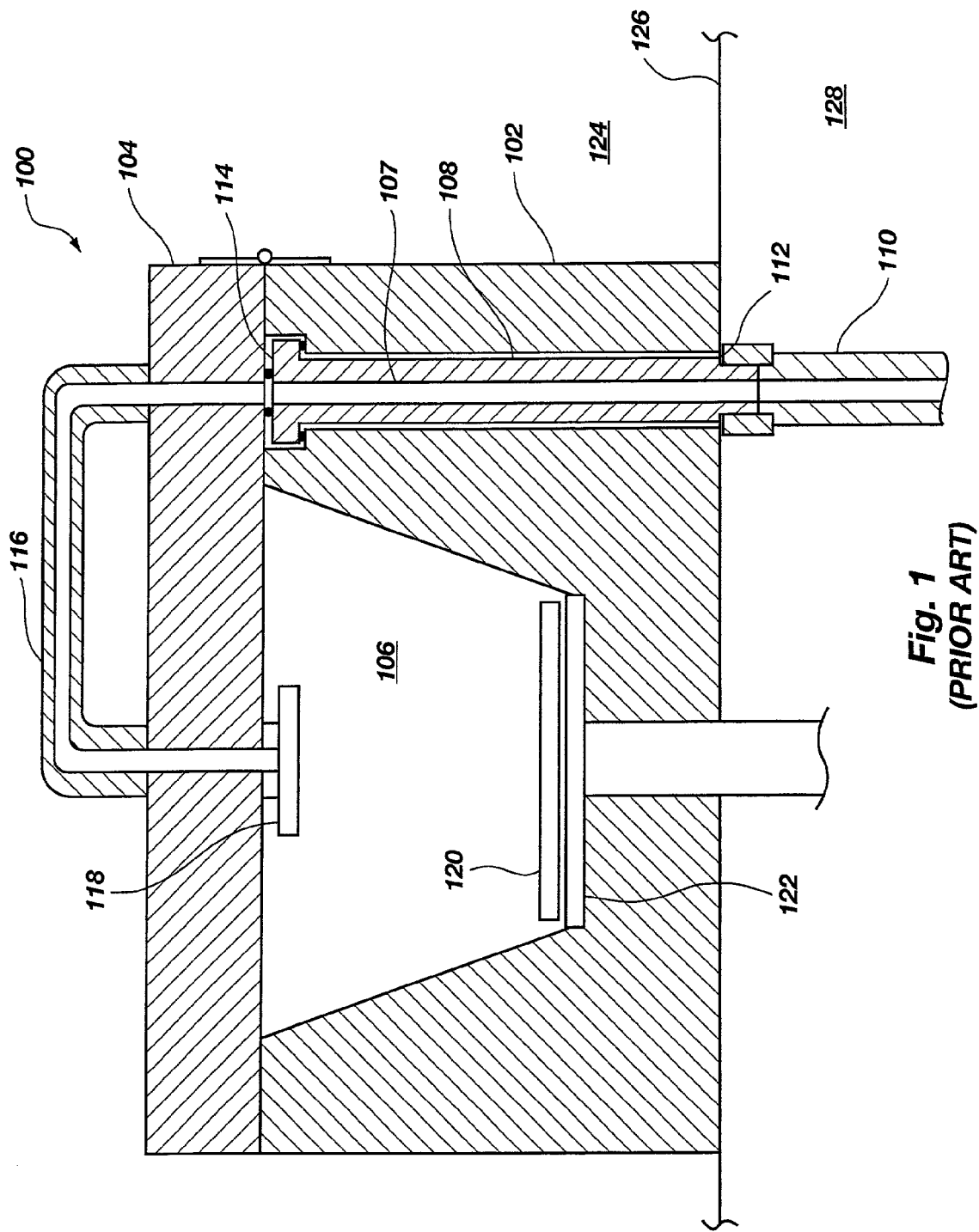
FIG. 1 is a partial cross section of a conventional chemical vapor deposition chamber.
Figure 2:
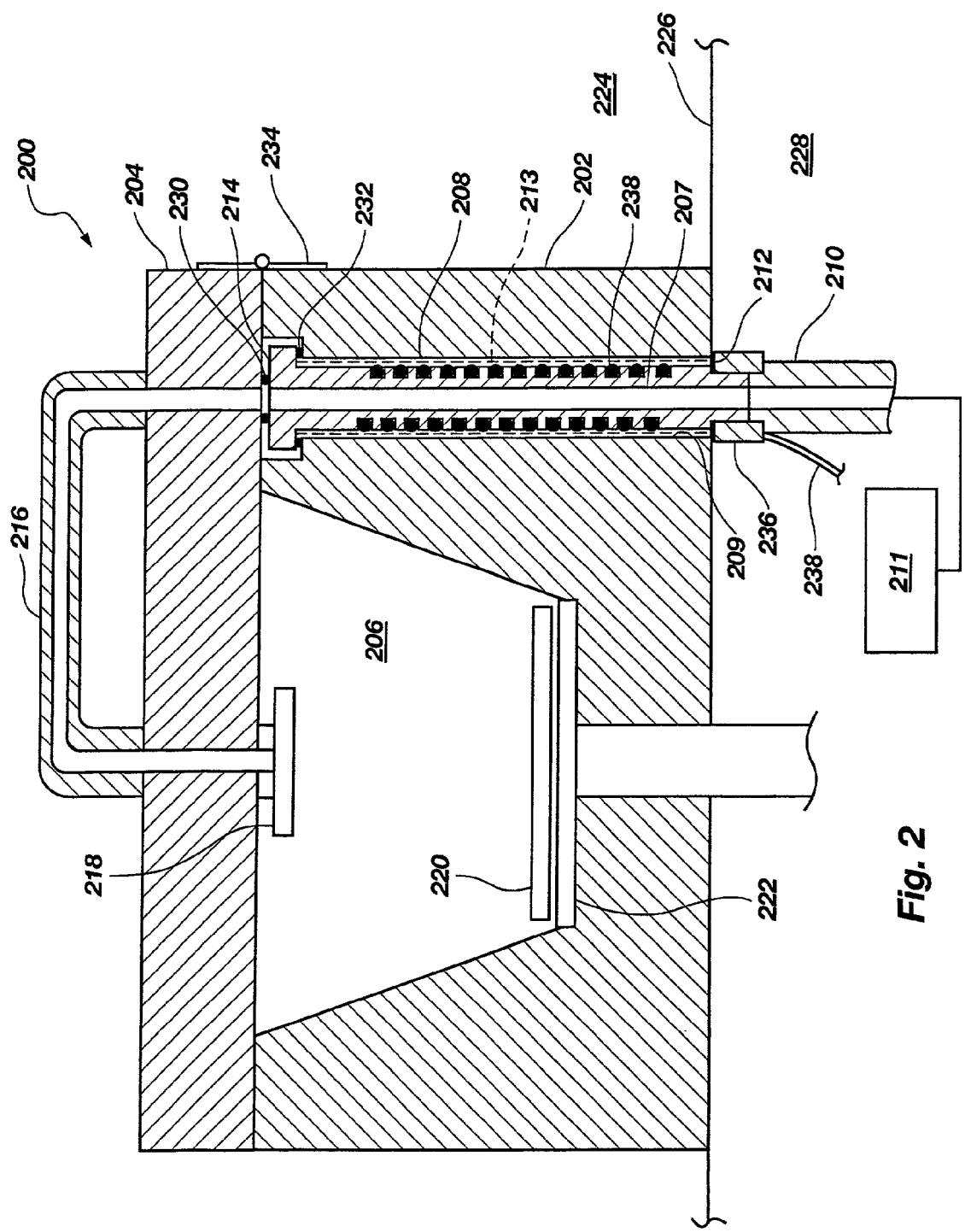
FIG. 2 is a partial cross section of an exemplary deposition chamber according to one embodiment of the present invention.

Referring to FIG. 2, a deposition chamber 200 according to one embodiment of the present invention is shown. It is noted that the deposition chamber 200 may be a chemical vapor deposition (CVD) chamber or an atomic layer deposition (ALD) chamber. Either type of chamber may be the subject of the present invention and thus, the invention shall generally refer to a deposition chamber 200 without being specifically designated as a CVD or ALD type chamber.

The deposition chamber 200 includes a chamber body 202 and a chamber lid 204. The chamber lid 204 is removable from the chamber body 202 for purposes of accessing and maintaining the chamber interior including the chamber cavity 206. A vapor delivery path 207 is formed through the chamber body 202 using a feedthrough device 208 disposed in a bore 209 in the chamber body 202. The vapor delivery path 207 connects to the heated vapor plumbing 210, and an associated vapor source 211, at the lower side of the chamber at one end 212 of the feedthrough device 208. The feedthrough device 208 is also coupled with additional vapor plumbing 216 via the chamber lid 204 at the second end 214 of the feedthrough device 208. The vapor delivery path 207 ultimately leads to a shower, or vapor delivery head 218 for discharging the vapor into the chamber cavity 206 for deposition onto a substrate 220 such as a silicon wafer which is positioned on a susceptor unit 222. The susceptor unit 222 may be mobile to assist in receiving individual substrates 220 from a location exterior to the deposition chamber 200 and subsequently positioning the received substrate 220 for the deposition process. The susceptor unit 222 may also include heating mechanisms for heating the substrate 220 during the deposition process as will be understood and appreciated by those of ordinary skill in the art.

It is noted that the deposition chamber 200 is located in an interstitial space such as a plenum 224 and that a barrier 226 separates the deposition chamber 200 from a mechanical or maintenance room 228. As is understood by those of ordinary skill in the art, it is desirable to locate various connections and equipment, such as the vapor plumbing 210, in the maintenance room 228 so as to reduce the likelihood of introducing particulates and contaminants within the plenum 224 or an adjacent clean room (not shown).

Still referring to FIG. 2, the vapor delivery path 207 travels through the chamber body 202 via the feedthrough device 208 and then through the chamber lid 204. A pair of seals 230, 232, such as o-rings, are respectively located to create a fluid tight seal between the second end 214 of the feedthrough device 208 and the chamber lid 204 and chamber body 202 when the chamber lid 204 is in a closed position. The feedthrough device 208 may be coupled to the heated vapor plumbing 210 by use of a coupling 236. One exemplary coupling includes a VCR® metal gasket face seal fitting available from Swagelok® whose corporate offices are located at 29500 Solon Road, Solon, Ohio 44139. Of course, other couplings and connecting devices may be used to couple the feedthrough device 208 to the heated vapor plumbing 210 as is understood by those of ordinary skill in the art.

The vapor delivery path 207 formed by the above-described arrangement allows for efficient maintenance and service of the deposition chamber 200 since the chamber lid 204 may be removed without the disconnection of any external vapor plumbing which would otherwise be fixedly located and coupled to the chamber lid 204 in a manner preventing raising of the chamber lid 204 without prior disconnection of the vapor plumbing. For example, using the configuration of the present invention, the chamber lid 204 may be removed by rotating it about a hinged connection 234 in order to access the chamber cavity 206. When the chamber lid 204 is closed, the vapor delivery path 207 will be restored with the seals 230 and 232 again, respectively forming a fluid tight connection between the feedthrough device 208 and chamber lid 204 and chamber body 202. Such simple access would not be possible with fixedly located vapor plumbing attached to the chamber lid 204.

It is noted that the vapor delivery path 207 shown in FIG. 2 is exemplary and need not include the exterior section of vapor plumbing 216 located on the chamber lid 204. Alternatively, for example, a vapor delivery path may include plumbing which is entirely contained in an interior section of the chamber lid 204 as the path extends from the feedthrough device 208 to the vapor delivery head 218. Such a configuration would still allow access to interior of the deposition chamber 200 without requiring mechanical connection and disconnection of hard piping within the plenum 224. However, such a configuration may also prove to be more difficult and expensive to fabricate than the embodiment depicted in FIG. 2.

A heating device 238 is utilized in conjunction with the feedthrough device 208 to maintain the temperature of the feedthrough device 208 and ultimately maintains the temperature of the vapor passing therethrough, at a predetermined level. Desirably, the heating device 238 maintains the temperature of the feedthrough device 208 at a temperature which is elevated relative to the temperature of the chamber body 202 and at a temperature similar to that of the heated vapor plumbing 210. The heating device 238 enters from the mechanical or maintenance room 228 into the chamber body 202 at the same location where the feedthrough device 208 is coupled with the heated vapor plumbing 210.

Figure 3:
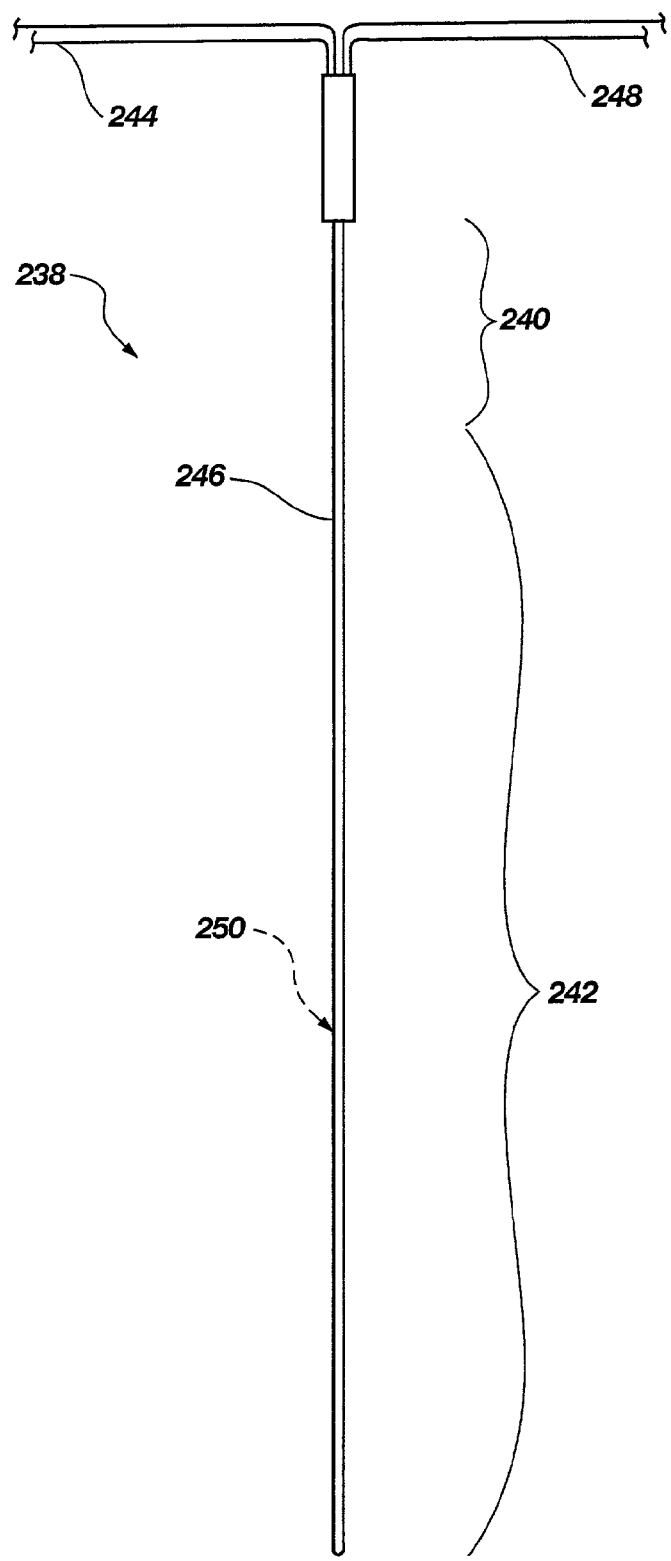
FIG. 3 shows a side view of an exemplary heating device for use with the deposition chamber of FIG. 2.

Referring to FIG. 3, an exemplary heating device 238 may include a cable heater, otherwise referred to as a resistance heater element, having a first unheated section 240 and a second heated section 242. Heat is provided from a source of alternating current (AC) via two leads 244 which may be configured to operate at 120 VAC and 315 W. The leads 244 extend into the resistance heater element where they are wrapped in a stainless steel, cold formable sheath 246 such that the heating device may be shaped and configured in a desired manner. A second pair of sensor leads 248 are also wrapped in the sheath 246 and are connected to a temperature sensing device 250 such as a thermocouple located about midway along the second heated section 242. The exemplary heating device 238, including sheath 246, may be approximately 0.125" in diameter and have a length of approximately 31". Of the 31" length, the unheated section 240 may include 4" and the heated section 242 may include 27". Such an exemplary cable heater is available from Watlow Electric Manufacturing Company with offices at 12001 Lackland Road, St. Louis, Mo. 63146 as part number 125FH031AX-1148.

It is noted that heating devices exhibiting other configurations, dimensions and constructions may be utilized with the present invention. For example the sheath need not be formed of stainless steel, but may be formed of other thermally conductive materials. Additionally, the diameter and length of the heating device 238, as well as the proportions of the heated and unheated sections 242, 240 may be varied to suit implementation with feedthrough devices 208 of varied design. Additionally, electrical characteristics of the resistance leads 244 may vary depending upon specific implementations, as will be appreciated by those of ordinary skill in the art.

Figure 4A:
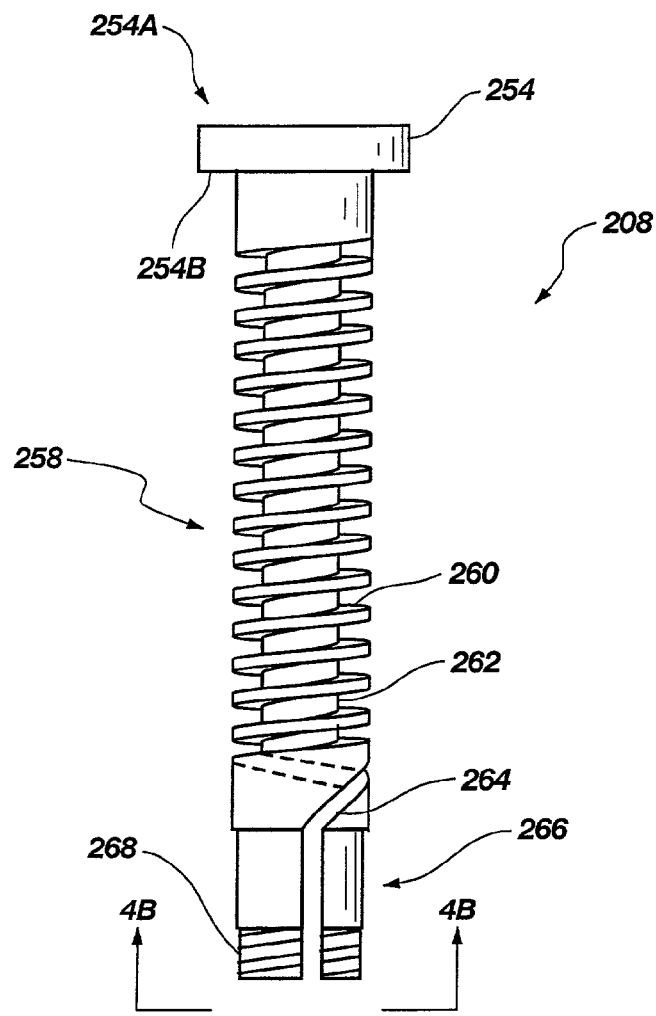
FIGS. 4A and 4B show a side view and end view respectively of an exemplary feedthrough device according to certain aspects of the present invention.
Figure 4B:
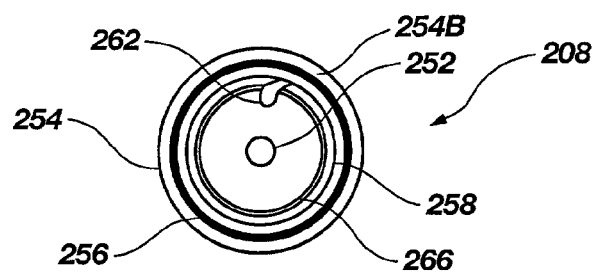

Referring to FIGS. 4A and 4B, a feedthrough device 208, configured for cooperative use with the heating device 238 (FIGS. 2 and 3) is shown. The feedthrough device 208 includes a bore or lumen 252 extending longitudinally therethrough and which forms a part of the vapor delivery path 207. The feedthrough device 208 further includes a shoulder portion 254 at its upper end. The shoulder portion 254 serves to locate and position the feedthrough device 208 within the chamber body 202. Additionally, as seen the FIG. 4B, one or more channels or grooves 256 may be formed in the top and bottom surfaces 254A and 254B of the shoulder portion 254 to accommodate o-rings or other types of seals 230, 232 (see FIG. 2).

A longitudinal body portion 258 makes up the majority of the feedthrough device 208 and includes a continual helical groove 260 formed on the surface thereof which is configured for receipt of the heating device 238. The size and pitch of the helical groove 260 may vary but will be determined in part by the size and configuration of the heating device 238. For example, a feedthrough device 208 having a longitudinal body portion 258 with a length of approximately 3.5" and an outer diameter of approximately 0.75" might be configured with a helical groove which is approximately 0.128" and exhibiting a pitch of approximately 0.2" for receipt of the exemplary heating device 238 described above herein.

The helical groove 260 includes a radiused inner portion 262 which serves to complementarily receive the sheath 246 of the exemplary heating device 238 thereby increasing the area of contact between the feedthrough device 208 and the heating device 238. Increased contact between the feedthrough device 208 and heating device 238 improves the transfer of heat therebetween resulting in an increased efficiency of the heating device 238 in heating the vapor passing therethrough.

The helical groove 260 makes a transition 264 near the bottom of the longitudinal body portion 258 and extends longitudinally outwardly through a coupling portion 266 of the feedthrough device 208. The coupling portion 266 is configured to be sealingly coupled with heated vapor plumbing 210. For example, the coupling portion 266 may include a series of threads 268 thereon for coupling the feedthrough device 208 to the heated vapor plumbing 210 through use of an appropriate fitting or coupling 236 (see FIG. 2).

The feedthrough device 208 is desirably formed of a material having a high thermal conductivity such as a metal having a relatively low impurity content. Such materials may include, for example, stainless steel or aluminum. Stainless steel and aluminum are desirable as they also provide protection against corrosion. Further, it is desirable to select a material which is metallurgically compatible with the conductive sheath 246 of the heating device 238 which is to be positioned in the helical groove 260 of the feedthrough device 208.

It is noted that the heating device 238 may include a sheath 246 which is cold formable, as set forth above, meaning that the heating device 238 may be formed into the helical groove 260 and substantially hold its position therein without having to hot work the heating device 238 or otherwise secure it. However, it may by desirable in certain cases to adhere the heating device 238, or at least a portion thereof, to the feedthrough device 208 regardless of whether a cold formable sheath 246 is being utilized. This may be accomplished, for example, by using conductive adhesive or by spot welding the sheath 246 to the feedthrough device 208.

Referring back to FIG. 2, in operation, the deposition chamber 200 delivers the vapor from a vapor source 211 through the heated vapor plumbing 210. As the vapor travels through the feedthrough device 208 it desirably maintains the same temperature as when it passes through the heated vapor plumbing 210. However, the temperature of the feedthrough device 208 is at least kept at a temperature sufficient to maintain the vapor state of the precursor material. This is accomplished by virtue of the heating device 238 operated in association with the feedthrough device 208. The temperature sensing device 250 allows for monitoring of the temperature at the feedthrough device 208 so that the temperature may be appropriately altered when required by increasing or providing power through the leads 244. The vapor further travels through the chamber lid 204 and vapor plumbing 216 to the vapor delivery head 218 for deposition on the substrate or wafer 220 without condensation occurring within the vapor delivery path 207.

It is noted that the vapor plumbing 216 which carries the vapor substantially from the feedthrough device 208 to the vapor delivery head 216 may be insulated to curtail any potential heat loss in that particular section of the vapor delivery path 207. However, heat loss along that section of the vapor delivery path 207 is considered to be less significant than the potential heat loss associated with the passage of vapor through the chamber body 202 via the feedthrough device 208.

Additionally, if desired, a layer of insulation, as shown in broken lines 213 on FIG. 2, may be disposed within the bore 209 between the interior portion of the chamber body 202 and the feedthrough device 208 allowing for greater efficiency in heating the feedthrough device 208 and for further isolation of the feedthrough device 208 from the temperature of the chamber body 202.

The present invention further lends itself to various methods employing the feedthrough device 208 disclosed herein. For example, a method of delivering vapor from the vapor source 211 to the vapor delivery head 218 can readily be seen with reference to FIG. 2. The method includes defining a vapor delivery path 207 by providing heated vapor plumbing 210 from the vapor source 211 to the chamber body 202. A feedthrough device 208 is provided and coupled to the heated vapor plumbing 210. Additional vapor plumbing 216 is provided to extend between the feedthrough device 208 and the vapor delivery head 218. The feedthrough device 208 is then heated using heating device 238 so as to eliminate condensation within the vapor delivery path 207 caused by cooling of the vapor due to temperature differentials between the chamber body 202 and the vapor as it travels through the feedthrough device 208.

Additionally, the use of a feedthrough device 208 in combination with the heating device 238 according to the present invention lends itself to a method of converting a CVD chamber to an ALD chamber, the ALD chamber requiring greater temperature control to maintain the associated precursors in a vapor state. The method of converting a CVD chamber to an ALD chamber includes removing an unheated feedthrough device from the CVD chamber body and replacing it with a heated feedthrough device. The heated feedthrough device may be either a new feedthrough device or the original feedthrough device modified in accordance with the present invention to allow heating thereof while positioned within the chamber body. Thus, the present invention provides an easy and economical means of updating and converting existing equipment in lieu of complete replacement of the same.

While the invention may be susceptible to various modifications and alternative forms, specific embodiments have been shown by way of example in the drawings and have been described in detail herein. However, it should be understood that the invention is not intended to be limited to the particular forms disclosed. Rather, includes all modifications, equivalents, and alternatives falling within the spirit and scope of the invention as defined by the following appended claims.

The invention claimed is:
1. A deposition chamber comprising:
a chamber body having a cavity formed therein;
a chamber lid configured to enclose the cavity;
a vapor delivery head positioned within the cavity;

a feedthrough device positioned in the chamber body, the feedthrough device having a longitudinal body portion and being configured to receive vapor from a vapor source and transfer the vapor therethrough along a pathway toward the vapor delivery head;

a heating device including at least one resistor element having at least a portion thereof disposed within a thermally conductive sheathing, the heating device including a nonheated section and a heated section, wherein at least a portion of the heated section is configured to conduct heat to the longitudinal body portion of the feedthrough device;

a layer of thermal insulation disposed between at least a portion of the thermally conductive sheathing of the heating device and the chamber body and substantially circumscribing the longitudinal body portion and the at least a portion of the thermally conductive sheathing, the layer of thermal insulation including at least a portion which is contiguous with at least one of a surface of the chamber body and a surface of the longitudinal body portion; and a temperature sensing device disposed between the layer of thermal insulation and the longitudinal body portion of the feedthrough device and configured to generate a signal representative of a temperature sensed thereby.

2. The deposition chamber of claim 1, wherein the feedthrough device includes a lumen defined therethrough for transferring the vapor therethrough.

3. The deposition chamber of claim 2, wherein the feedthrough device includes a continual helical groove formed on a surface of the longitudinal body portion.

4. The deposition chamber of claim 3, wherein the at least a portion of the heated section is disposed within the continual helical groove of the feedthrough device.

5. The deposition chamber of claim 4, wherein the continual helical groove is configured to complementarily receive the at least a portion of the heated section.

6. The deposition chamber of claim 1, wherein the thermally conductive sheathing is formed of stainless steel.

7. The deposition chamber of claim 1, wherein the temperature sensing device is disposed within the thermally conductive sheathing.

8. The deposition chamber of claim 1, wherein the temperature sensing device includes a thermocouple.

9. The deposition chamber of claim 8, wherein the thermocouple is positioned within the thermally conductive sheathing.

10. The deposition chamber of claim 3, wherein at least a portion of the thermally conductive sheathing is configured to maintain the heating device in a substantially helical pattern complementary with the continual helical groove.

11. The deposition chamber of claim 1, wherein at least a portion of the thermally conductive sheathing is adhered to the feedthrough device.

12. The deposition chamber of claim 1, wherein at least a portion of the thermally conductive sheathing is welded to the feedthrough device.

* * * * *

UNITED STATES PATENT AND TRADEMARK OFFICE
CERTIFICATE OF CORRECTION

| | |
|---|---|
| PATENT NO. | : 7,090,727 B2 |
| APPLICATION NO. | : 09/932860 |
| DATED | : August 15, 2006 |
| INVENTOR(S) | : Carpenter et al. |

Page 1 of 1

It is certified that error appears in the above-identified patent and that said Letters Patent is hereby corrected as shown below:

On the face page, in field (54), in "Title", in column 1, line 3, delete "FOR" and insert -- OF --, therefor.

In column 1, line 3, delete "FOR" and insert -- OF --, therefor.

Signed and Sealed this

Fifteenth Day of April, 2008

JON W. DUDAS
*Director of the United States Patent and Trademark Office*